United States Patent [19]

Kainosho et al.

[11] Patent Number: 4,929,564

[45] Date of Patent: May 29, 1990

[54] METHOD FOR PRODUCING COMPOUND SEMICONDUCTOR SINGLE CRYSTALS AND METHOD FOR PRODUCING COMPOUND SEMICONDUCTOR DEVICES

[75] Inventors: Keiji Kainosho; Haruhito Shimakura; Osamu Oda, all of Toda, Japan

[73] Assignee: Nippon Mining Co., Ltd., Tokyo, Japan

[21] Appl. No.: 421,680

[22] Filed: Oct. 16, 1989

[30] Foreign Application Priority Data

Oct. 21, 1988 [JP] Japan .................................. 63-265340
Dec. 28, 1988 [JP] Japan .................................. 63-334588

[51] Int. Cl.$^5$ ........................................... H01L 21/265
[52] U.S. Cl. ..................................... 437/20; 437/247; 437/225; 437/22
[58] Field of Search ................. 437/248, 945, 946, 20, 437/174, 10, 22, 240

[56] References Cited

U.S. PATENT DOCUMENTS

4,357,180  11/1982  Molnar ................................ 437/945
4,676,840   6/1987  Matsumura .......................... 437/174

FOREIGN PATENT DOCUMENTS

0112723  9/1981  Japan ...................................... 437/22

OTHER PUBLICATIONS

Wilkie et al., "Implantation Damage Control of Silicon in Diffusion During Rapid Thermal Annealing of InP Using AlN/Si$_3$N$_4$ as an Encapsulant".

Primary Examiner—Brian E. Hearn
Assistant Examiner—Trung Dang
Attorney, Agent, or Firm—McAulay, Fisher, Nissen & Goldberg

[57] ABSTRACT

The present invention relates to a method for producing InP single crystals containing impurities such as Fe, Co, Ti, Cr or the like by cutting the single crystals into wafers or blocks and heat-treating the cut wafers or blocks at temperatures ranging from 400° C. to 690° C. Further, the invention is related to a method for producing compound semiconductor devices employing Fe-doped InP single crystals as the substrate of the device. In this method, the InP single crystals are cut into wafers and the cut wafers are heat-treated at temperatures ranging from 400° C. to 690° C. Further, the wafers are implanted with ions and heat-treated at 690° C. or lower to activate the implanted ions. These methods ensure to produce the single crystals and the compound semiconductor devices which have superior electrical properties.

4 Claims, 8 Drawing Sheets

METHOD FOR PRODUCING COMPOUND SEMICONDUCTOR SINGLE CRYSTALS AND METHOD FOR PRODUCING COMPOUND SEMICONDUCTOR DEVICES

BACKGROUND OF THE INVENTION (1) Field of the Invention

The present invention relates to a method for producing compound semiconductor single crystals and a method for producing compound semiconductor devices, and further a method for heat-treating compound semiconductor materials. More particularly, the present invention relates to the technique available for producing Fe-doped InP single crystals and the compound semiconductor devices employing these single crystals as their substrates.

(2) Description of the Prior Art

Various methods for producing compound semiconductor single crystals have been well known. For example, a seed crystal is immersed in melted solution of the crystal in a crucible and then the seed crystal is pulled up with rotating it relative to the crucible to grow the single crystal from the seed crystal. As an alternative method, the melted solution is gradually solidified to grow the single crystal. In industrial scale, Liquid Encapsulated Czochralski Method (LEC Method) belonged to the former method, and Gradient Freeze Method (GF Method), Horizontal Bridgeman Method (HB Method), and Vertical Bridgeman Method (VB Method) belonged to the latter method.

Although these single crystal growing methods have a little difference with each other, crystals are grown in basically similar process that the temperature gradient between the crystal and the melted solution is generated to gradually solidify the melted solution. In the process, while the interface between the liquid and the solid where the crystal is grown is kept at the melting point, but the part to the crystal grown already is kept at the lower temperature than the melting point. Accordingly, these single crystal producing methods can not avoid the production of inhomogeneous single crystals.

For example, in order to produce MESFETs employing an undoped semi-insulating GaAs single crystals as the substrates, Rumsby provided a method for annealing GaAs single crystal ingots at high temperatures from 700 to 1000° C. to decrease the variation in the electrical properties of the crystal. This ingot annealing method intended to transfer impurities and inherent defects such as EL2 in the crystal so as to homogenize the crystal properties, referring to "D. Rumsby, R. M. Ware, B. Smith, M. Tyjberg, M. R. Brozel and E. J. Foulkes GaAs IC Symposium, Phoenix, Technical Digest (1983)34–37".

Conventionally, Fe-doped InP single crystals have been also sometimes subjected to the ingot-annealing at the high temperatures when the single crystals have been used as the substrates for MISFETs or OEICs.

In order to fabricate electronic devices such as MESFETs, MISFETs, and so on employing the compound semiconductor, impurities such as Si, S, Se, or the like are ion implanted into the wafers and then heat-treated to form active layers, and electrodes and insulating layers have been deposited on the active layers. Conventionally, in the case that Fe-doped InP single crystals are used as the substrates, the heat-treatment to form the active layers has been carried out at 700° C. or higher.

However, the heat-treatment of the crystal ingots at temperatures ranging from 700° C. to 1000° C. can homogenize the resistivity across the wafer to a certain extent, but this was not sufficient for practical use.

Therefore the electronic devices such as MISFETs and OEICs employing Fe-doped InP single crystals as the substrates can be used for research purposes, but they have not yet been practically used in industrial field. The practical use of these devices has been tremendously retarded in comparison with MESFETs using GaAs substrate. Even though some reasons for the above described demerits have been considered, the inventors have found that while the heat-treatment of Fe-doped InP single crystal ingots or wafers can homogenize the resistivity across the wafers after crystal ingot annealing to some extent, the heat treatment for activating the wafers at 700° C. or higher deteriorates the homogeneity of electrical properties across the wafer. Even if the compound semiconductor devices are produced by employing thus produced wafers, such devices would not be satisfactory for the practical use.

BRIEF SUMMARY OF THE INVENTION

It is the primary object of the present invention to provide a method for producing compound semiconductor single crystals containing Fe, Co, Ti or Cr with superior homogeneity of the electrical properties across the wafer.

Another object of the present invention is to provide a method for producing a compound semiconductor devices employing the above compound semiconductor single crystals, which have superior homogeneity of electrical properties.

To accomplish the above objects, the inventors carried out the experiments. Fe-doped InP single crystals were subjected to annealing under various conditions and it was found that Fe-doped InpP single crystals annealed at low temperatures (in the range from 400° C. to 690° C.) showed superior homogeneity of electrical properties across the wafer in comparison with conventionally produced crystal wafers which were as-grown or annealed at high temperatures. In order to find the reason of this effect, the Fe-doped InP wafers annealed at low temperatures; at highest 700° C., were further subjected to a mirror-surface polishing and then $Si_3N_4$ (SiNx) layer was deposited on the polished wafer. Thus obtained wafer samples were subjected to heat-treatment at various temperatures. Alternatively, $Si_3N_4$ (SiNx) layer was deposited on the polished wafer without ion implantation, and thus obtained wafer samples were subjected to heat-treatment at various temperatures.

According to the above experiments, the heat-treatment at 700° C. or higher resulted in tremendously deteriorating the homogeneity of resistivity across the wafer. The reason of this phenomenon was estimated that some Fe atoms diffuse in Fe-doped InP single crystals and precipitates or some point defects (vacancies, complex defects or the like) are generated in the crystal.

In addition to the above phenomenon, though the electrical properties of the wafer were once homogenized by low temperature annealing, the properties would be tremendously deteriorated again when the activating heat-treatment after ion implantation was carried out at 700° C. or higher.

As a result from the repetition of further experiments, the inventors found that the homogeneity of the electrical properties across the wafer was not affected by the process that Fe-doped InP single crystal wafer were annealed at temperatures ranging from 400° C. to 690° C. and then the wafers were subjected to mirror-surface polishing and ion implantation, and finally to an activating heat treatment at 690° C. or lower.

The invention was established by the above knowledge, and therefore the inventors provide the method to accomplish the above objects, comprising (a) a cutting step for cutting an ingot of compound semiconductor single crystals containing at least one of impurities such as Fe, Co, Ti, and Cr, into wafers or blocks; and (b) a heat-treating step for heat-treating the wafers or the blocks at temperatures ranging from 400° C. to 690° C. In a preferable mode at the heat-treating step, the wafers or the blocks are installed in a quartz ampoule with a compositional element of the compound semiconductor single crystal or other compound semiconductor material composed at least of the compositional element and they are evacuated and sealed and then the inner pressure of the quartz ampoule is increased to at least the dissociation pressure of the compound semiconductor single crystal. Thus prepared quartz ampoule is heat-treated at temperatures ranging from 400° C. to 690° C.

As another aspect of the present invention, the method for producing compound semiconductor devices comprising (a) a heat treating step for heat treating the wafers of the compound semiconductor single crystals of Fe-doped InP at temperatures ranging from 400° C. to 690° C., (b) a mirror surface polishing step for polishing the heat-treated wafers, (c) an ion-implantation step for implanting ions into the polished wafers, and (d) an activating heat-treatment step for heat-treating the wafers at a temperature of 690° C. or lower.

In the method for producing compound semiconductor single crystals according to the present invention, the wafers or blocks cut from the compound semiconductor single crystal ingots are subjected to heat-treatment so that heat distribution in the crystal can be easily homogenized in comparison with the crystal ingots per se. Further, since the heat-treatment is carried out under the pressure higher than the dissociation pressure of the compound semiconductor material, the compositional element of the compound semiconductor material can be prevented from volatilizing during the heat-treatment. The temperature of the heat-treatment is limited to the range lower than 690° C. and thus the dopants such as Fe, Co, and so on are prevented from precipitating in the crystal. As a result, these effects multiply to improve remarkably the homogeneity of the resistivity across the wafer of the compound semiconductor single crystal.

In the method for producing compound semiconductor devices according to the present invention, the wafers of the Fe-doped InP single crystals are annealed at such low temperature to accomplish the homogeneity of the electrical properties across the wafer. Further, the activating heat-treatment at 690° C. or lower after ion implantation step can maintain the homogeneity of the electrical properties.

Other and further objects, features and advantages of the invention will become obvious upon an understanding of the illustrative embodiments about to be described or will be indicated in the appended claims, and various advantages not referred to herein will occur to one skilled in the art upon employment of the invention in practice.

BRIEF DESCRIPTION OF THE DRAWINGS

FIG. 1(a), (b), (c), (d), and (e) are graphs showing the distribution of the resistivities across the wafer measured by the Van der Pauw method, wherein FIG. 1(a) shows the resistivity distribution prior to annealing, FIG. 1(b), (c), (d) and (e) show the resistivity distributions resulted from the annealing at 450° C., 520° C., 620° C., and 720° C. for 5 hours, respectively;

FIG. 2(a) and (b) are graphs showing the distribution of the resistivities across the wafer measured by the three electrode guard method, wherein FIG. 2(a) shows the resistivity distribution prior to annealing.

DESCRIPTION OF THE PREFERRED EMBODIMENTS

1. First Embodiment

Fe-doped InP single crystals of diameter 2 inch and 100 mm in length were grown by the Liquid Encapsulated Czochralski (LEC) method. The purity of InP polycrystals used in this method was with the carrier concentration between $1 \times 10^{15}$ and $3 \times 10^{15}$ cm$^{-3}$. The prepared single crystals had Fe-cocentrations from 0.2 to 1.0 ppm. The both ends of the prepared single crystal (ingots) were cut and the cut ingots were shaped into a cylinder. Then this shaped ingots were cut into wafers of 0.7 mm thickness. These cut wafers were etched with Br-methanol 2% solution and washed, and then subjected to heat-treatment.

In this heat-treatment, 50 wafers and red phosphorus were installed in each quartz ampoule. The ampoules were evacuated and sealed, and then they were respectively heated at 450° C., 520° C., 620° C., and 720° C. for 5 hours. The amount of the red phosphorus was so controlled that the phosphorus pressure in the quartz ampoule will be 0.5 atm.

Figure 1A:
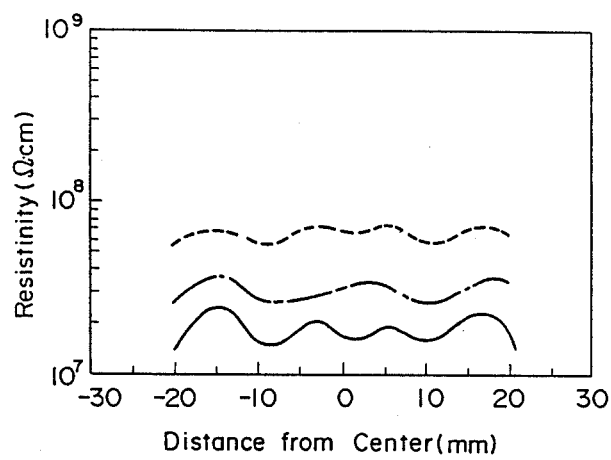
Figure 1B:
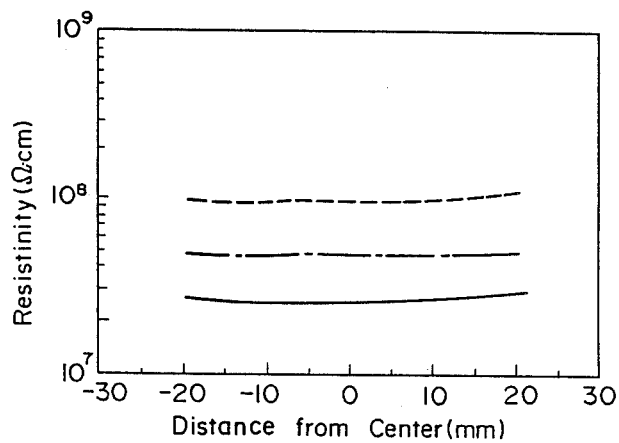
Figure 1C:
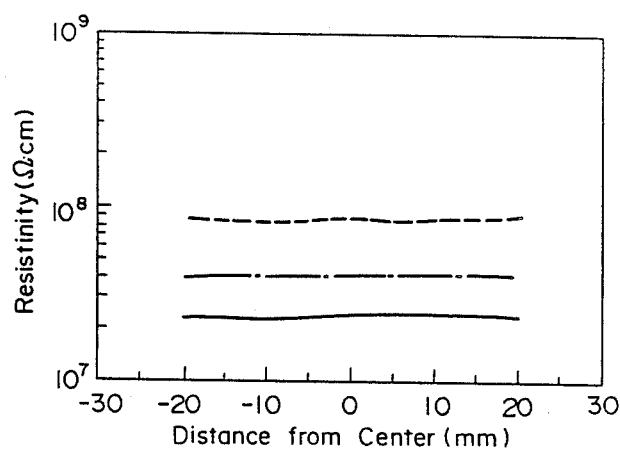
Figure 1D:
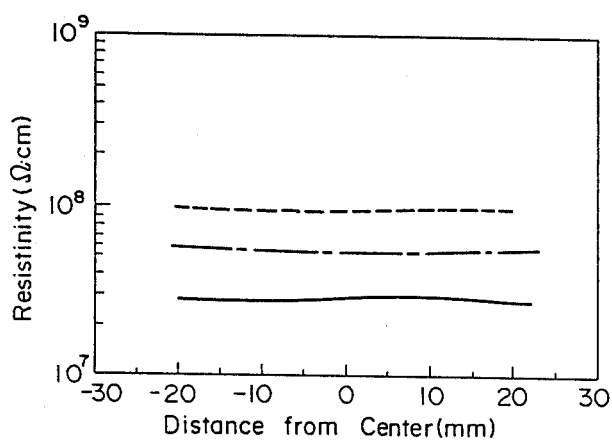
Figure 1E:
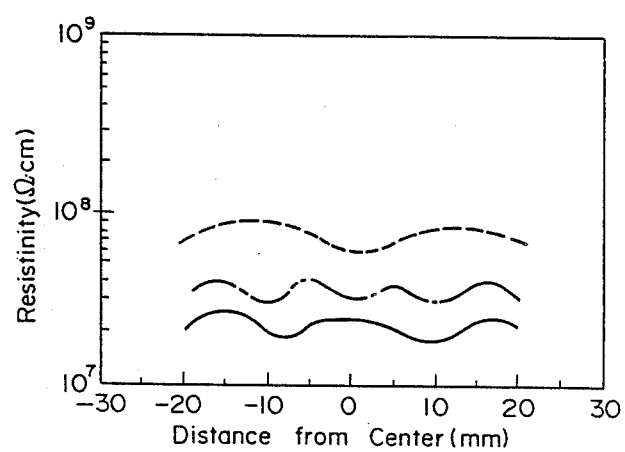

FIG. 1(a), (b), (c), (d) and (e) show the distribution of the resistivities across the wafer measured by the Van der Pauw method; i.e., variations in resistivity measured at intervals of 5 mm in radial direction from the center of the wafer. The same treatment was repeated on three type wafers which were cut from the top, middle and tail sections of the crystal ingot. FIG. 1(a) shows the result from the wafers before annealing. FIG. 1(b), (c), (d), and (e) show the results form the wafers annealed at 50° C., 520° C., 620° C., and 720° C. for 5 hours. In these figures, the solid line represents the resistivity of the top section wafer; the chain line represents the resistivity of the middle section wafer; and the dotted line represents the resistivity of the tail section wafer.

As is clear from FIG. 1(a) to (e), the variations in the resistivity resulted from the wafers treated at 450° C., 520° C. and 620° C. are remarkably decreased in comparison with the wafers before the heat-treatment. But the variation in the resistivity of the wafers treated at 720° C. are almost similar to that of before the heat-treatment.

Figure 2A:
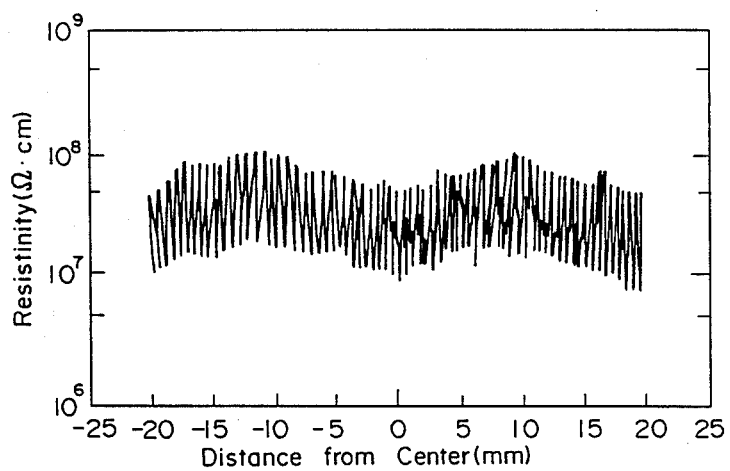
Figure 2B:
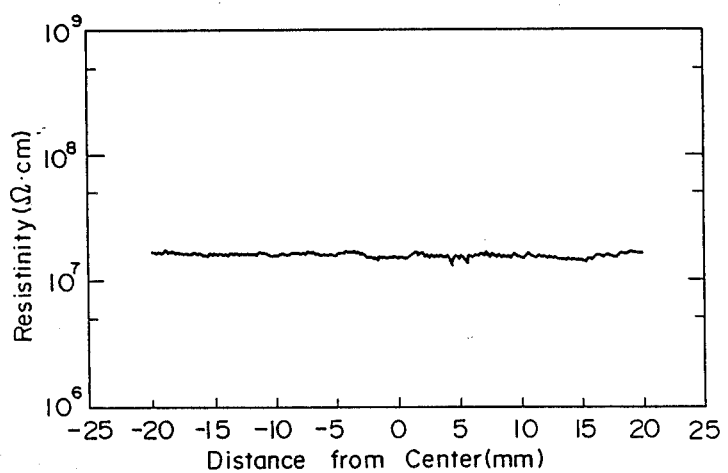
FIG. 2(b) shows the resistivity distribution resulted from the annealing at 520° C. for 5 hours.

FIG. 2(a) and (b) are graphs showing the distribution of the resistivities across the wafer measured by the three electrode guard; i.e., variations in the resistivity measured at intervals of 100 μm radial direction from the center of the wafer. The same treatment was repeated on three type wafers which were cut from the top, middle and tail sections of the crystal ingot. FIG. 2(a) shows the variation of 53% resulted from the wafers before annealing, and FIG. 2(b) shows the variation of 5% resulted from the wafers after annealing at 520° C. for 5 hours. Further, not shown in the drawings, the wafers after annealing at 450° C. and 620° C. for 5 hours result in the variation ratio in the range from 5 to 10%.

According to the results from FIG. 1(a) to (e) and FIG. 2(a) and (b), the Fe-doped InP single crystal wafers annealed at such low temperature can improve the homogeneity of the resistivity variations across the wafer.

Figure 3:
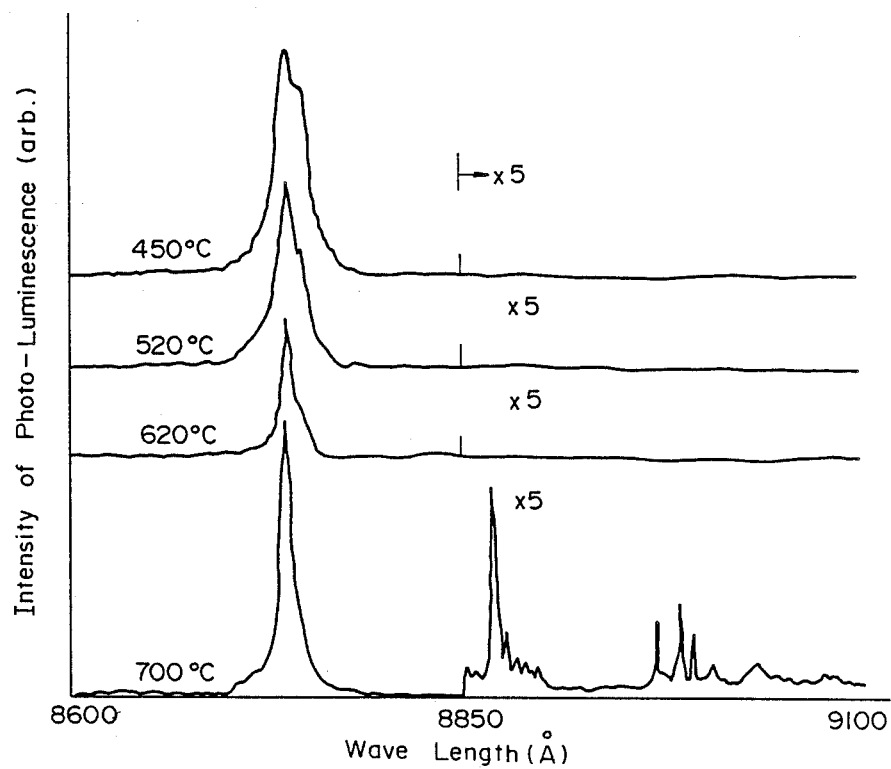
FIG. 3 is a graph showing the intensity of photoluminescence resulted from the wafers cut from a crystal ingot which are heat-treated at various temperatures.

Further, the wafers cut from the crystal ingot were respectively subjected to heat-treatments at temperatures 450° C., 520° C., 620° C. and 700° C., and then photoluminescence (PL) was measured. The measured results are shown in FIG. 3. While the high temperature annealing (700° C.) provides many peaks in the long length wave region, the wafers annealed at temperatures between 400° C. and 690° C. provide superior results.

The peaks appeared in the long length wave region would be caused by the precipitates of Fe or the generation of point defects (vacancies, complex defects) in the single crystal at the high temperature heat-treatment, but this relationship has not yet confirmed experimentally. In addition to Fe, the compound semiconductor containing other impurities such as Co, Ti, Cr and so on would provide the similar effect.

As explanation above, in the first embodiment the compound semiconductor single crystal ingot containing at least one of impurities such as Fe, co, Ti and Cr was cut into blocks or wafers, and the blocks or wafers are installed in a quartz ampoule with the compositional element of the compound semiconductor single crystal or another compound semiconductor single crystal including the same compositional element. The ampoule is evacuated and sealed, and further the inner pressure of the ampoule is kept at the pressure higher than the dissociation pressure of the compound semiconductor single crystal and the ampoule is heated at a temperature between 400° C. and 690° C. Since this method employs the wafers or blocks of the compound semiconductor, they are more uniformly heated than in the case of the ingot so that they can be free from thermal stress generation. Further, since they are heated under the pressure higher than the dissociation pressure of the compound semiconductor single crystal, the compositional element of the compound semiconductor is prevented from volatilizing during the heat-treatment.

The temperature of the heat-treatment is limited to the range lower than 690° C. and thus the dopants such as Fe, Co, and so on are prevented from precipitating in the crystal. As a result, these effects multiply to improve remarkably homogeneity of the electrical properties across the wafer of the compound semiconductor single crystals containing impurities such as Fe, Co, Ti, Cr and so on.

2. Second Embodiment

Fe-doped InP single crystals of diameter 2 inch and 100 mm in length were grown by the Liquid Encapsulated Czochralski (LEC) method. The purity of InP polycrystals used in this method was with carrier concentration between $1 \times 10^{15}$ and $3 \times 10^{15}$ cm$^{-3}$. The prepared single crystals had Fe-concentrations from 0.2 to 1.0 ppm. The both ends of the prepared single crystals (ingots) were cut and the cut ingots were shaped into a cylinder. Then this shaped ingots were cut into wafers of 0.7 mm thickness. These cut wafers were etched with Br-methanol 2% solution and washed, and then subjected to heat-treatment.

In this heat-treatment, 50 wafers and red phosphorus were installed in each quartz ampoule. The ampoules were evacuated and sealed, and heated at 520° C. for 5 hours. the amount of the red phosphorus was so controlled that the phosphorus pressure in the quartz ampoule will be 0.5 atm.

Thus prepared wafers were polished and implanted with Si-ions, and then on both surfaces SiNx layer of 1500 Å thickness were deposited by sputtering method. Further they were respectively subjected to activating heat-treatment at 570° C., 620° C., 670° C. and 700° C. for 15 min.

In order to study if the homogeneity of properties of the substrate is stable to the heat-treatment, some wafers without the ion implantation were subjected to the capped-annealing under the same conditions of the activating heat-treatment.

Figure 4A:
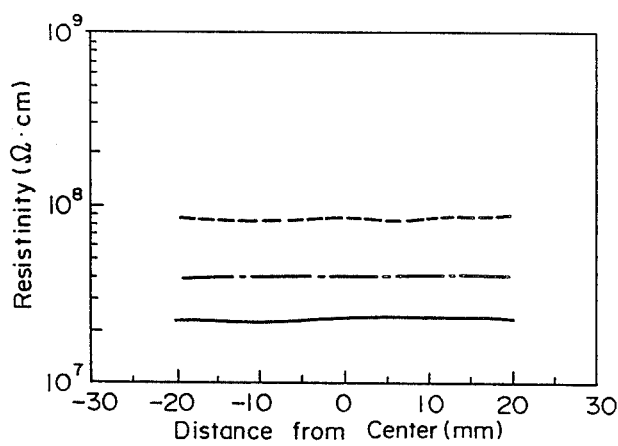
FIG. 4(a), (b), (c), and (d) are graphs showing the distribution of the resistivities across the wafer resulted from the wafer samples which are respectively subjected to capped-annealing at 670° C., 570° C., 620° C., and 700° C. under the same conditions of the activating heat-treatment without the ion implantation.
Figure 4B:
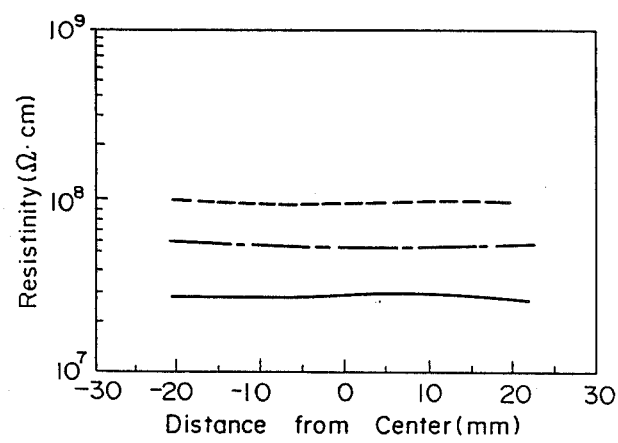
Figure 4C:
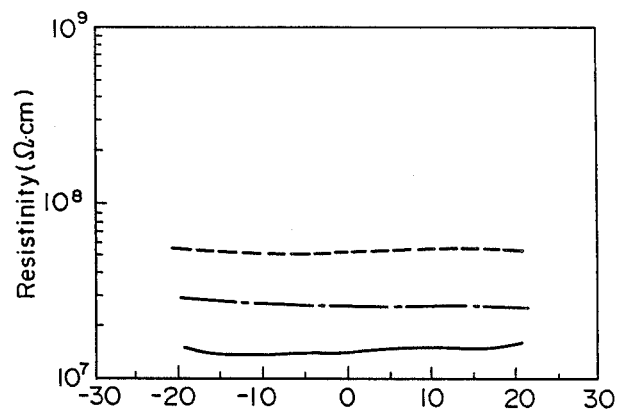
Figure 4D:
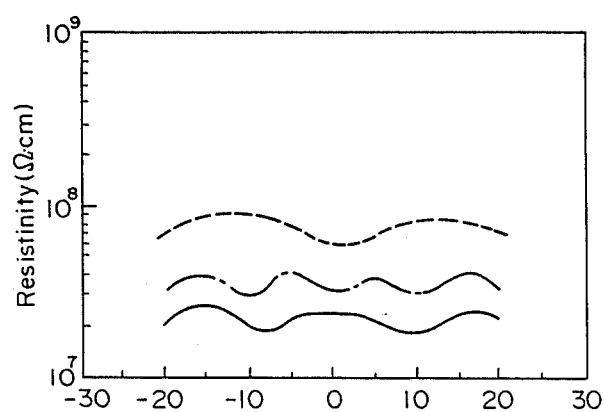

FIG. 4(a), (b), (c), and (d) show the distribution of the resistivities across the wafer at intervals of 5 mm measured by Van der Pauw method; i.e., the variations in resistivity resulted from the wafer samples which are respectively subjected to capped-annealing at 670° C., 570° C., 620° C., and 700° C. under the same conditions of the activating heat-treatment without the ion implantation. In these figures, the solid line represents the resistivity of the top section wafer; the chain line represents the resistivity of the middle section wafer; and the dotted line represents the resistivity of the tail section wafer.

As is clear from FIG. 4(a), (b), (c), and (d), the wafers subjected to the activating heat-treatment at 690° C. or lower can keep the homogeneity of the resistivities across the wafer regardless of after capped annealing, though the homogeneity of the resistivities of the wafers heated at 700° C. becomes poor.

In a conventional method for producing FETs employing Fe-doped InP single crystals, the wafers of Fe-doped InP single crystals have been implanted with Si-ion and then capped with SiNx layers or PSG layers, and further subjected to activating heat-treatment at 700° C. for 15 min. Therefore the wafers were subjected to a first annealing at 520° C. in the same manner as the embodiment of the present invention to homogenize the resistivities across the wafer, and the wafers without the ion-implantation were secondly subjected to capped-annealing at various temperatures. According to this experiment, the wafers annealed at 700° C. or higher showed extremely poor homogeneity of resistivities. This phenomenon would be caused by the precipitation of Fe or the generation of point defects (vacancies, complex defects) in the Fe-doped InP single crystal.

Figure 5:
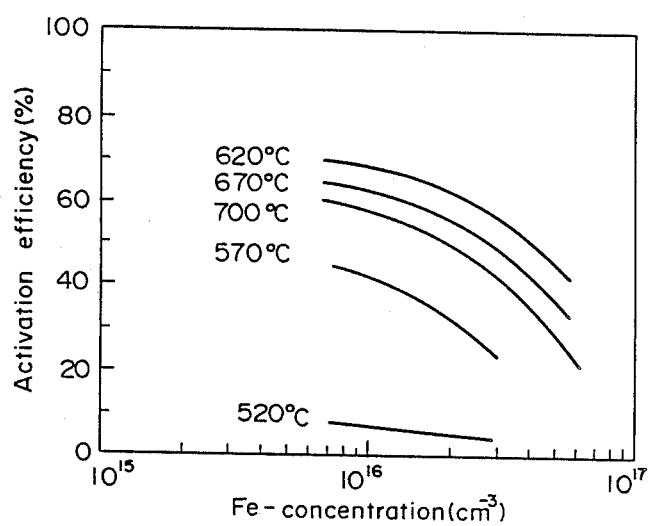
FIG. 5 is a graph showing the relationship between the Fe-concentration and the activation efficiency resulted from the wafer samples which are subjected to the activating heat-treatment at various temperatures.

FIG. 5 shows the relationship between the Fe-concentration and the activation efficiency resulted from the wafers which are implanted with Si-ion and then subjected to activating heat-treatment. As is clear from FIG. 5, the wafers treated at 670° C. and 620° C. have higher activation efficiency rather than that treated at 700° C. by a conventional method. In addition to this, the wafers treated at 570° C. have also the activation efficiency at least 40% which can be properly adapted for the substrates for electronic devices.

As given explanation above, the method according to the second embodiment provides the process that the wafers of the Fe-doped InP single crystals are heat-treated at temperatures ranging from 400° C. to 690° C., their surfaces are polished, the wafers are implanted with ions, and they are subjected to the activating heat-treatment at the temperature 690° C. or lower. This method ensures to fabricate the compound semiconductor devices with superior properties.

As many apparently widely different embodiments of this invention may be made without departing from the spirit and scope thereof, it is to be understood that the invention is not limited to the specific embodiments thereof except as defined in the appended claims.

What is claimed is:

1. A method for producing compound semiconductor single crystals comprising;
    (a) cutting step for cutting an ingot of a compound semiconductor single crystal containing at least one of impurities such as Fe, Co, Ti and Cr into wafers or blocks; and
    (b) a heat-treating step for heat-treating the wafers or the blocks installed in an evacuated and sealed quartz ampoule at the temperatures ranging from 400° C. to 690° C.

2. The method according to claim 1, wherein said heat-treating step is characterized that said wafers or said blocks are installed in said evacuated and sealed quartz ampoule with a compositional element of said compound semiconductor single crystal or other compound semiconductor material composed of said compositional element and the inner pressure of said quartz ampoule is increased to at least the dissociation pressure of said compound semiconductor single crystal.

3. The method according to claim 1, wherein said compound semiconductor single crystal is InP single crystal.

4. A method for producing compound semiconductor devices comprising;
    (a) a heat-treatment step for heat-treating the wafers of a Fe-doped InP single crystal at temperatures ranging from 400° C. to 690° C.;
    (b) a mirror surface polishing step for polishing said heat-treated wafers;
    (c) an ion implantation step for implanting ions into said polished wafers; and
    (d) an activating heat-treatment step for heat-treating said wafers at the temperature of 690° C. or lower.

* * * * *